(12) United States Patent
Choi et al.

(10) Patent No.: US 11,934,076 B2
(45) Date of Patent: Mar. 19, 2024

(54) ARRAY SUBSTRATE AND MANUFACTURING METHOD THEREOF, AND DISPLAY PANEL

(71) Applicants: Fuzhou BOE Optoelectronics Technology Co., Ltd., Fujian (CN); BOE Technology Group Co., Ltd., Beijing (CN)

(72) Inventors: Daelim Choi, Beijing (CN); Jinliang Wang, Beijing (CN); Liangliang Li, Beijing (CN); Rong Wu, Beijing (CN)

(73) Assignees: Fuzhou BOE Optoelectronics Technology Co., Ltd., Fujian (CN); BOE Technology Group Co., Ltd., Beijing (CN)

( * ) Notice: Subject to any disclaimer, the term of this patent is extended or adjusted under 35 U.S.C. 154(b) by 319 days.

(21) Appl. No.: 17/429,781

(22) PCT Filed: Oct. 29, 2020

(86) PCT No.: PCT/CN2020/124760
§ 371 (c)(1),
(2) Date: Aug. 10, 2021

(87) PCT Pub. No.: WO2022/087954
PCT Pub. Date: May 5, 2022

(65) Prior Publication Data
US 2022/0308415 A1 Sep. 29, 2022

(51) Int. Cl.
*G02F 1/1362* (2006.01)
*G02F 1/1333* (2006.01)

(52) U.S. Cl.
CPC .. *G02F 1/136295* (2021.01); *G02F 1/136209* (2013.01); *G02F 1/136222* (2021.01); *G02F 1/133354* (2021.01)

(58) Field of Classification Search
CPC ............. G02F 1/136286; G02F 1/1368; G02F 2201/52
See application file for complete search history.

(56) References Cited

U.S. PATENT DOCUMENTS 6,657,606 B2 * 12/2003 Kang .................. H05K 1/0281
349/150
6,989,300 B1 * 1/2006 Tanabe ................ H01L 21/0262
438/164

(Continued)

FOREIGN PATENT DOCUMENTS

| CN | 101013197 A | 8/2007 |
| CN | 105572998 A | 5/2016 |

(Continued)

*Primary Examiner* — Ryan Crockett
(74) *Attorney, Agent, or Firm* — Nath, Goldberg & Meyer; Joshua B. Goldberg

(57) ABSTRACT

The present disclosure provides an array substrate and a manufacturing method thereof, and a display panel. The array substrate includes at least one marking member in at least one marking sub-region and at least one bonding lead in at least one bonding sub-region, and the at least one marking sub-region and/or the at least one bonding sub-region are further provided with: a first substrate; a first reflecting layer on the first substrate; and a first light absorbing layer on a side of the first reflecting layer distal to the first substrate. The at least one marking member and/or the at least one bonding lead is on a side of the first light absorbing layer distal to the first substrate.

16 Claims, 6 Drawing Sheets

(56) References Cited

U.S. PATENT DOCUMENTS

| | | | | |
|---|---|---|---|---|
| 8,023,093 B2* | 9/2011 | Fukuda | ............... | G02F 1/1347 |
| | | | | 349/158 |
| 9,161,439 B2* | 10/2015 | Hayashi | ............... | H05K 1/0269 |
| 2002/0182518 A1* | 12/2002 | Van Haren | ............ | G03F 9/7076 |
| | | | | 430/4 |
| 2004/0195704 A1* | 10/2004 | Nakata | ................. | H01L 23/544 |
| | | | | 257/E23.179 |
| 2009/0059141 A1* | 3/2009 | Nagasawa | ............ | G02F 1/1333 |
| | | | | 349/111 |
| 2009/0098283 A1* | 4/2009 | Jang | ................... | G02B 26/0841 |
| | | | | 427/164 |
| 2011/0273651 A1* | 11/2011 | Kim | ................... | H01L 27/1251 |
| | | | | 349/110 |
| 2014/0035171 A1* | 2/2014 | Yang | ................... | H01L 23/544 |
| | | | | 257/797 |
| 2018/0364530 A1* | 12/2018 | Wang | ................. | H01L 27/1288 |
| 2020/0343329 A1* | 10/2020 | Wang | ................. | H10K 59/131 |
| 2021/0066672 A1* | 3/2021 | Dai | ..................... | H10K 59/124 |
| 2022/0173173 A1* | 6/2022 | Suo | ..................... | G02F 1/13685 |

FOREIGN PATENT DOCUMENTS

| | | | |
|---|---|---|---|
| CN | 107946322 A | | 4/2018 |
| CN | 113345864 A | * | 9/2021 |
| JP | 2013065739 A | * | 4/2013 |

* cited by examiner

ARRAY SUBSTRATE AND MANUFACTURING METHOD THEREOF, AND DISPLAY PANEL

This is a National Phase Application filed under 35 U.S.C. 371 as a national stage of PCT/CN2020/124760, filed Oct. 29, 2020, the content of which is hereby incorporated by reference in its entirety.

TECHNICAL FIELD

The present disclosure relates to the field of display technology, and in particular to an array substrate and a manufacturing method thereof, and a display panel.

BACKGROUND

At present, in the monitor (MNT) market, due to increasing aesthetic of a product appearance, borderless products are loved by customers due to their exquisite appearance. Therefore, a proportion of client borderless model planning also becomes higher. In particular, an appearance of four-side borderless products is more high-brand.

However, since no border is provided around the borderless product, there is no border in the borderless product used for covering the structures in the border region, that is, the structures in the peripheral region at least partially surrounding the display region of the borderless product, such as bonding leads, marking members, and the like, are exposed.

SUMMARY

According to one aspect of the present disclosure, an array substrate is provided. The array substrate includes a display region and a peripheral region at least partially surrounding the display region, the peripheral region including at least one marking sub-region and/or at least one bonding sub-region, the at least one marking sub-region being provided with at least one marking member, and the at least one bonding sub-region being provided with at least one bonding lead, wherein the at least one marking sub-region and/or the at least one bonding sub-region is further provided with: a first substrate; a first reflecting layer on the first substrate; and a first light absorbing layer on a side of the first reflecting layer distal to the first substrate, wherein the at least one marking member and/or the at least one bonding lead is on a side of the first light absorbing layer distal to the first substrate.

Optionally, the peripheral region further includes at least one driving sub-region, at least one of the display region and the at least one driving sub-region is provided with at least one driving signal line, and the at least one of the display region and the at least one driving sub-region is further provided with: a second light absorbing layer on the first substrate, wherein the at least one driving signal line is on a side of the second light absorbing layer distal to the first substrate.

Optionally, the peripheral region further includes at least one fan-out sub-region, the at least one fan-out sub-region is provided with at least one signal connection line, and the at least one signal connection line is configured to couple the at least one bonding lead to the at least one driving signal line in a one-to-one correspondence; and a third light absorbing layer is further provided between the at least one bonding lead and the first substrate at connection positions of the at least one bonding lead with the at least one signal connection line.

Optionally, the first light absorbing layer, the second light absorbing layer and the third light absorbing layer are in a same layer; and the at least one marking member, the at least one bonding lead, the at least one driving signal line and the at least one signal connection line are in a same layer.

Optionally, a material of the first reflecting layer includes molybdenum niobium.

Optionally, the first reflecting layer has a thickness from 200 angstrom to 300 angstrom.

Optionally, the first reflecting layer has a thickness of 250 angstrom.

Optionally, a material of the first light absorbing layer, the second light absorbing layer and the third light absorbing layer includes molybdenum oxide, and a material of the at least one marking member, the at least one bonding lead, the at least one driving signal line and the at least one signal connection line includes copper.

Optionally, a thickness of the first light absorbing layer, the second light absorbing layer and the third light absorbing layer is in a range from 400 angstrom to 500 angstrom.

Optionally, orthographic projections of the at least one marking member and the at least one bonding lead on the first substrate are in an orthographic projection of the first light absorbing layer on the first substrate respectively; an orthographic projection of the at least one driving signal line on the first substrate is in an orthographic projection of the second light absorbing layer on the first substrate; and an orthographic projection of the at least one signal connection line on the first substrate is in an orthographic projection of the third light absorbing layer on the first substrate.

Optionally, orthographic projections of the at least one marking member and the at least one bonding lead on the first substrate at least partially overlap with an orthographic projection of the first reflecting layer on the first substrate.

Optionally, at least one driving signal line in at least one display region is a gate line.

According to another aspect of the present disclosure, a display panel is provided. The display panel includes: the above array substrate; a color filter substrate opposite to the array substrate; and a liquid crystal layer between the array substrate and the color filter substrate, wherein a first substrate in the array substrate is on a side of the array substrate distal to the liquid crystal layer.

According to another aspect of the present disclosure, a method for manufacturing an array substrate is provided. The method includes: providing a first substrate; forming a first reflecting layer on the first substrate; forming a first light absorbing layer on the first reflecting layer; and forming at least one marking member and/or at least one bonding lead on the first light absorbing layer, such that the first reflecting layer and the first light absorbing layer are in at least one marking sub-region and/or in at least one bonding sub-region in a peripheral region of the array substrate, the at least one marking member is on the first light absorbing layer in the at least one marking sub-region, the at least one bonding lead is on the first light absorbing layer in the at least one bonding sub-region, wherein the array substrate further includes a display region, and the peripheral region at least partially surrounds the display region.

Optionally, the method further includes forming a second light absorbing layer and at least one driving signal line, wherein forming a second light absorbing layer and at least one driving signal line includes: forming the second light absorbing layer in a same process as forming the first light absorbing layer, forming the at least one driving signal line in a same process as forming the at least one marking member and/or the at least one bonding lead, such that the second light absorbing layer is in at least one driving sub-region in the peripheral region and the display region of the array substrate, and the at least one driving signal line is on a side of the second light absorbing layer distal to the first substrate.

Optionally, the method further includes forming a third light absorbing layer and at least one signal connection line, wherein forming a third light absorbing layer and at least one signal connection line includes: forming the third light absorbing layer in a same process as forming the first light absorbing layer, forming the at least one signal connection line in a same process as forming the at least one marking member and/or the at least one bonding lead, such that the at least one signal connection line is in at least one fan-out sub-region in the peripheral region of the array substrate, and the third light absorbing layer is between the at least one bonding lead and the first substrate at connection positions of the at least one bonding lead and the at least one signal connection line.

Optionally, forming the first reflecting layer on the first substrate includes forming the first reflecting layer by molybdenum niobium.

Optionally, the first reflecting layer has a thickness in a range from 200 angstrom to 300 angstrom.

Optionally, the first reflecting layer has a thickness of 250 angstrom.

Optionally, forming the at least one marking member and/or the at least one bonding lead on the first light absorbing layer includes forming the at least one marking member and/or the at least one bonding lead on the first light absorbing layer such that orthographic projections of the at least one marking member and/or the at least one bonding lead on the first substrate at least partially overlap with an orthographic projection of the first reflecting layer on the first substrate.

BRIEF DESCRIPTION OF THE DRAWINGS

In order to more clearly illustrate the technical solutions of the embodiments of the present disclosure, the following will briefly introduce the drawings required to be used in the embodiments or related technical descriptions. It is obvious that the drawings in the following description only relate to some embodiments of the present disclosure and do not limit the present disclosure.

FIG. 2b is a cross-sectional view of resulted structures taken along a line A-A' in FIG. 2a in steps of a procedure of manufacturing the array substrate shown in FIG. 2a;

FIG. 2c is a schematic diagram illustrating identification of a marking member of the array substrate shown in FIG. 2a;

FIG. 2d is a schematic diagram illustrating detection of the number of bonding leads of the array substrate shown in FIG. 2a;

DETAILED DESCRIPTION

In order to make the purpose, the technical solution and the advantage of the embodiments of the present disclosure clearer, the technical solution of the embodiments of the present disclosure will be described below clearly and completely in combination with the drawings of the embodiments of the present disclosure.

Figure 1:
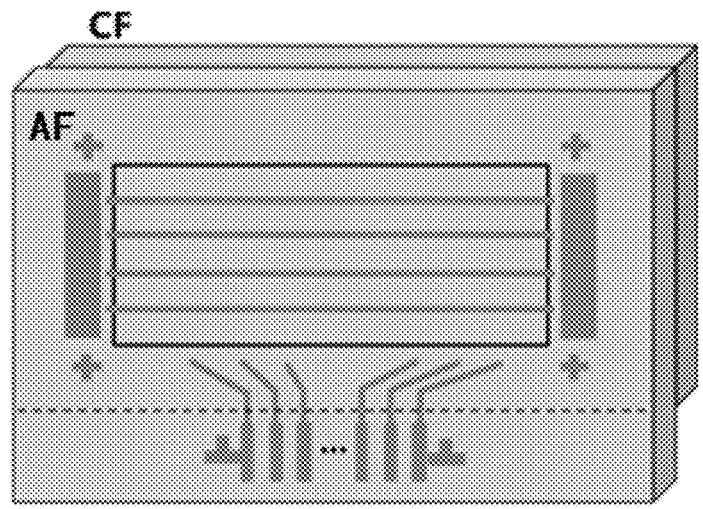
FIG. 1 is a front view of a four-side borderless display panel in the related art.

FIG. 1 is a front view of a four-side borderless display panel in the related art. As shown in FIG. 1, in the four-side borderless display panel, a color filter (CF) substrate is on a side of an array substrate distal to an observer, and metal lines (for example, gate lines) on the array substrate face the observer. The metal lines are not blocked and will reflect light, resulting in phenomena, such as high light reflectivity, newton rings, and the like, which seriously affect visual effect.

At present, in the related art, multi-layer insulating films are used to reduce the light reflectivity of the metal lines by the principle of mutual interference of reflected light, but it will lead to decrease of transmittance and poor decrease of light reflectivity of the display panel. In addition, in the related art, a molybdenum oxide (MoOx) film may be provided on a side of a gate metal proximal to the observer. Since the molybdenum oxide is black, the light reflection of the gate metal may be reduced.

Figure 2A:
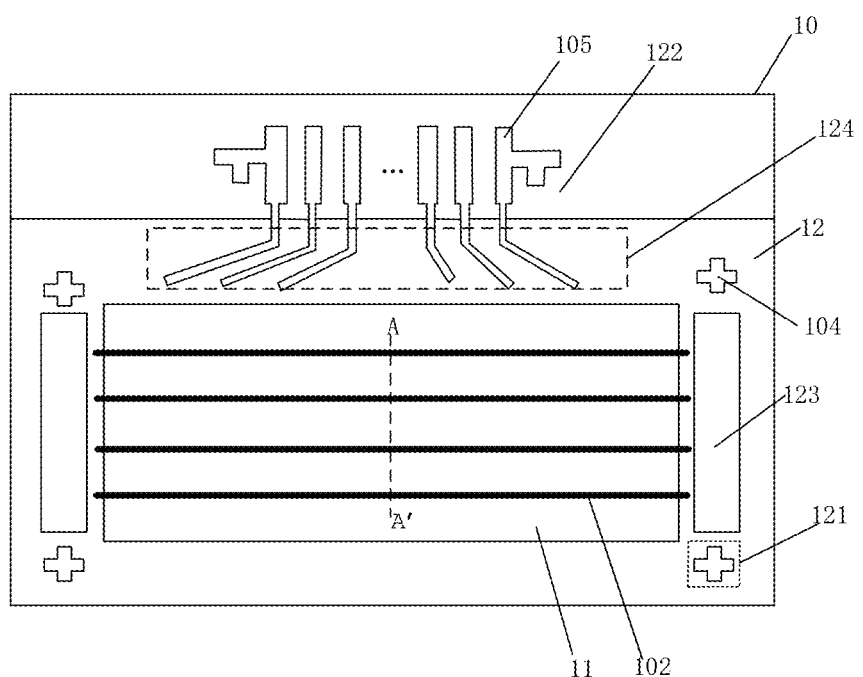
FIG. 2a is a top view of an array substrate in the related art.

FIG. 2a is a top view of an array substrate in the related art. The array substrate 10 includes a display region 11 and a peripheral region 12 at least partially surrounding the display region 11. The peripheral region 12 further includes at least one marking sub-region 121, at least one bonding sub-region 122, at least one driving sub-region 123 and at least one fan-out sub-region 124.

Figure 2B:
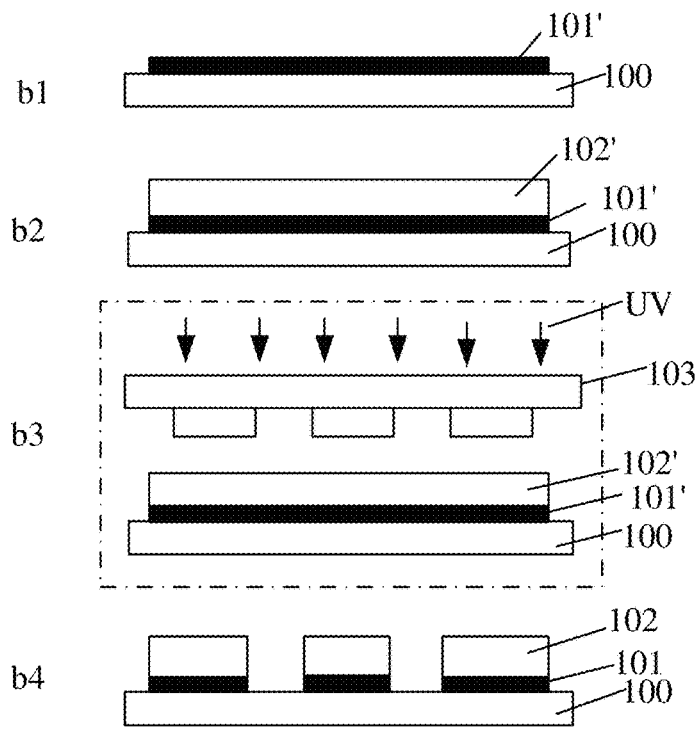

FIG. 2b is a cross-sectional view of resulted structures taken along a line A-A' in FIG. 2a in steps of a procedure of manufacturing the array substrate shown in FIG. 2a.

In step b1, firstly, a layer of molybdenum oxide is deposited on a substrate 100 to form a molybdenum oxide material layer 101'. In step b2, a layer of metal material is deposited on the deposited molybdenum oxide material layer 101' to form a metal material layer 102'. In step b3, an exposure process is performed on the molybdenum oxide material layer 101' and the metal material layer 102' by using a mask 103 and ultraviolet (UV) light. In step b4, the exposed molybdenum oxide and metal material are developed and etched to form a molybdenum oxide layer 101 and a wiring layer 102 (for example, gate lines).

Figure 2C:
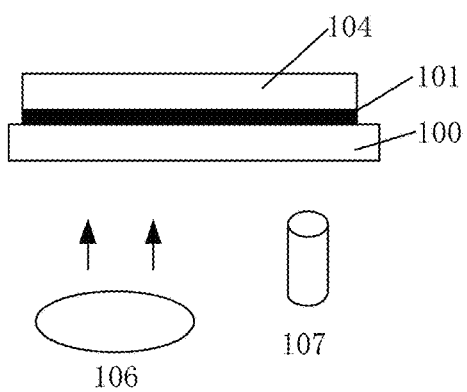

FIG. 2c is a schematic diagram illustrating identification of a marking member 104 of an array substrate shown in FIG. 2a. As shown in FIG. 2a, at least one marking member 104 is provided in the marking sub-region 121, and is formed in a single and same process as the wiring layer 102 in the display region 11, and the molybdenum oxide layer 101 is also provided between the at least one marking member 104 and the substrate 100. As shown in FIG. 2c, when the marking member 104 is being identified, detection light emitted by a light source 106 penetrates through the substrate 100 to reach the molybdenum oxide layer 101, and is absorbed by the molybdenum oxide layer 101. In this way, the detection light cannot reach the marking member 104, and cannot be reflected back to an optical detector 107 by the marking member 104, so that the identification of the marking member 104 cannot be achieved.

Figure 2D:
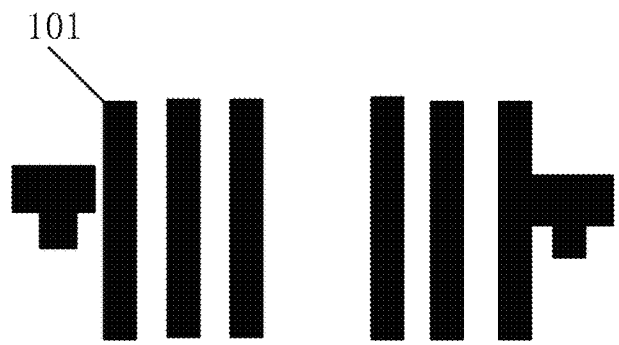

FIG. 2d is a schematic diagram illustrating detection of the number of bonding leads of an array substrate shown in FIG. 2a. Similarly, for the bonding leads 105 in the bonding sub-region 122, similar to the marking members 104, the molybdenum oxide layer 101 is also provided between the bonding leads 105 and the substrate 100, so that the detection light cannot reach the bonding leads 105 and cannot be reflected back to the optical detector 107 by the bonding leads 105, resulting in not achieving identification of the bonding leads 105.

Figure 3A:
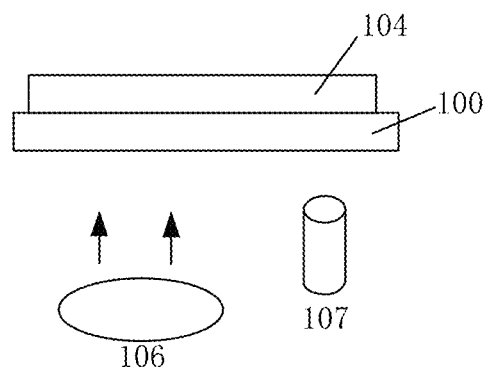
FIG. 3a is a schematic diagram illustrating identification of a marking member of an array substrate in the related art.
Figure 3B:
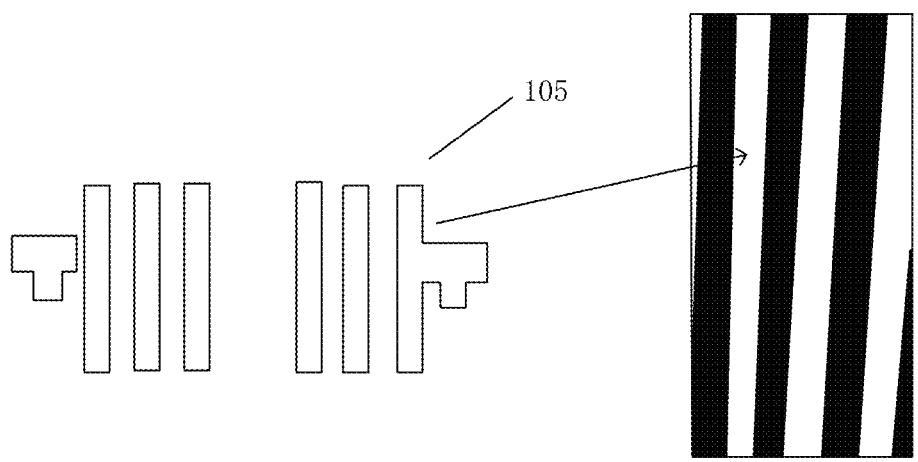
FIG. 3b is a schematic diagram illustrating detection of the number of bonding leads of an array substrate in the related art.

FIG. 3a is a schematic diagram illustrating identification of a marking member 104 of an array substrate in the related art. As shown in FIG. 3a, the molybdenum oxide layer 101 is not provided between the substrate 100 and the marking members 104. FIG. 3b is a schematic diagram illustrating detection of the number of bonding leads of an array substrate in the related art. As shown in FIG. 3b, the molybdenum oxide layer 101 is not provided between the substrate 100 and the bonding leads 105. In this way, the detection light emitted by the light source 106 penetrates through the substrate 100 to reach the marking members 104 and the bonding leads 105. The detection light can be reflected back to the optical detector 107 by the marking members 104 and the bonding leads 105, so that the marking members 104 and the bonding leads 105 can be identified.

The molybdenum oxide solution shown in FIG. 2a will lead to problems such as abnormal identification of the marking members, unable detection of the number of the bonding leads, and the like, which does not achieve mass production. The metal lines of the array substrate as shown in FIG. 3a face the observer (i.e., a side where the light source 106 is located), and light reflection of the metal lines will occur and result in the phenomena, such as high light reflectivity, newton rings, and the like, which seriously affect the visual effect.

Figure 4:
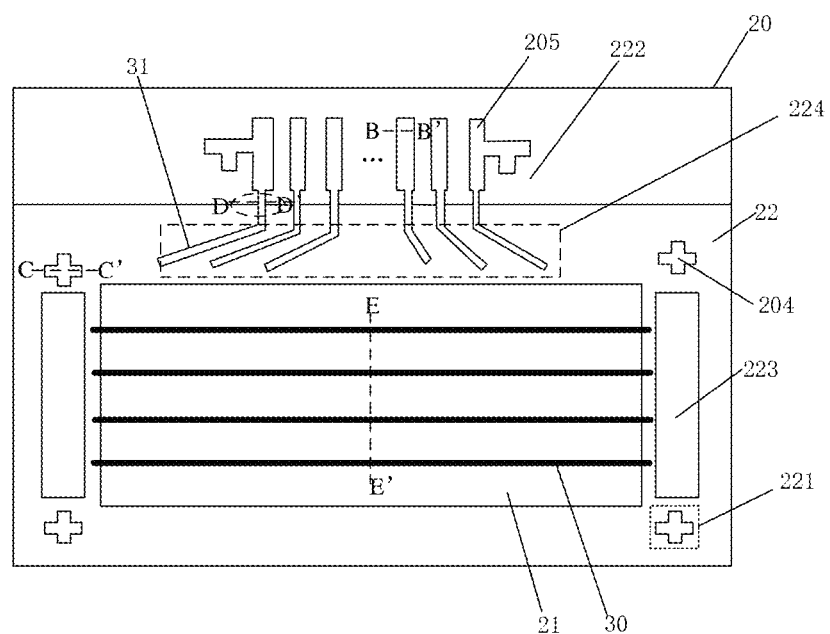
FIG. 4 is a top view of an array substrate according to an embodiment of the present disclosure.
Figure 5A:
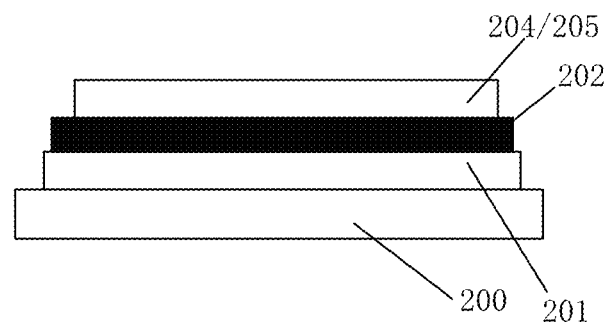
FIG. 5a is a cross-sectional view of an array substrate along a line B-B' or C-C' in FIG. 4 according to an embodiment of the present disclosure.

Thus, the present disclosure provides an array substrate to solve at least one of the above problems. FIG. 4 is a top view of an array substrate according to an embodiment of the present disclosure. As shown in FIG. 4, an array substrate 20 includes a display region 21 and a peripheral region 22 at least partially surrounding the display region 21. The peripheral region 22 includes at least one marking sub-region 221 and/or at least one bonding sub-region 222. At least one marking member 204 is provided in the at least one marking sub-region 221, and at least one bonding lead 205 is provided in the at least one bonding sub-region 222. FIG. 5a is a cross-sectional view of an array substrate along a line B-B' or C-C' in FIG. 4 according to an embodiment of the present disclosure. As shown in FIG. 5a, the at least one marking sub-region 221 and/or the at least one bonding sub-region 222 are further provided with: a first reflecting layer 201 on a side of the first substrate 200; and a first light absorbing layer 202 on a side of the first reflecting layer 201 distal to the first substrate 200. The at least one marking member 204 and/or the at least one bonding lead 205 are on a side of the first light absorbing layer 202 distal to the first substrate 200.

In the present disclosure, in the at least one marking sub-region 221 and/or the at least one bonding sub-region 222, the first reflecting layer 201, the first light absorbing layer 202 and the marking member 204 or the bonding lead 205 are successively provided in a direction away from the first substrate 200. In this way, when the at least one marking member 204 is being identified or the number of the at least one bonding lead 205 is being checked, detection light irradiates on the first reflecting layer 201 and then is reflected by the first reflecting layer 201 back to an optical detector, so as to achieve the identification of the at least one marking member 204 and the determination of the number of the at least one bonding lead 205.

Optionally, as shown in FIG. 4, the peripheral region 22 further includes at least one driving sub-region 223. At least one driving signal line is provided in the display region 21 and/or the at least one driving sub-region 223. FIG. 5c is a cross-sectional view of an array substrate along a line E-E' in FIG. 4 according to an embodiment of the present disclosure. As shown in FIG. 5c, the display region and/or the at least one driving sub-region are further provided with a second light absorbing layer 302 on a side of the first substrate 200, and the at least one driving signal line is on a side of the second light absorbing layer 302 distal to the first substrate 200.

Optionally, the at least one driving signal line in at least one display region may be a gate line 30. The first light absorbing layer 202 is on a side of the gate line 30 proximal to the first substrate 200, which may at least absorb external ambient light irradiating on the gate line 30, thereby reducing light reflectivity of the gate line 30 facing the observer, and reducing or even eliminating newton rings.

Figure 5B:
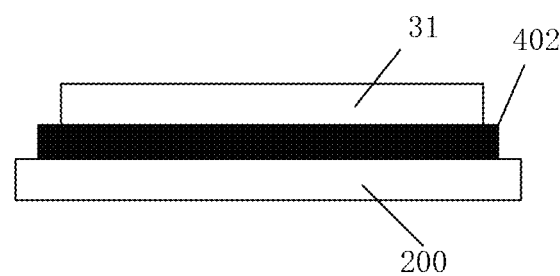
FIG. 5b is a cross-sectional view of an array substrate along a line D-D' in FIG. 4 according to an embodiment of the present disclosure.
Figure 5C:
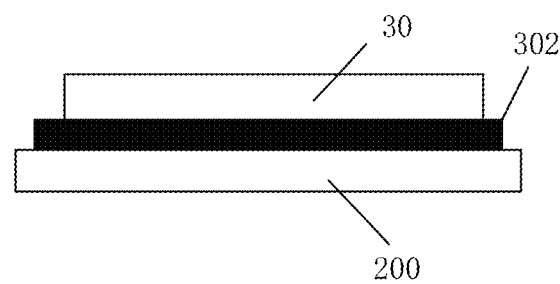
FIG. 5c is a cross-sectional view of an array substrate along a line E-E' in FIG. 4 according to an embodiment of the present disclosure.

FIG. 5b is a cross-sectional view of an array substrate along a line D-D' in FIG. 4 according to an embodiment of the present disclosure. As shown in FIG. 4, the peripheral region 22 further includes at least one fan-out sub-region 224. At least one signal connection line 31 is provided in the at least one fan-out sub-region 224. The at least one signal connection line 31 is configured to couple the at least one bonding lead 205 to the at least one driving signal line 31 in one-to-one correspondence. Moreover, a third light absorbing layer 402 is provided between the at least one bonding lead 205 and the first substrate 200 at connection positions of the at least one bonding lead 205 with the at least one signal connection line 30. That is to say, the third light absorbing layer 402 is directly on the first substrate 200, while the first reflecting layer 201 is not provided between the third light absorbing layer 402 and the first substrate 200. The arrangement is beneficial to surface flatness of the array substrate.

Optionally, the first light absorbing layer 202, the second light absorbing layer 302 and the third light absorbing layer 402 are in a same layer, and the at least one marking member 204, the at least one bonding lead 205, the at least one driving signal line 30 and the at least one signal connection line 31 are in a same layer. That is to say, the first light absorbing layer 202, the second light absorbing layer 302 and the third light absorbing layer 402 are formed by a same material in a single process, and the at least one marking member 204, the at least one bonding lead 205, the at least one driving signal line 30 and the at least one signal connection line 31 are formed by a same material in a single process, thus simplifying manufacturing process of the array substrate.

Optionally, a material of the first reflecting layer 201 includes molybdenum niobium (MoNb). According to requirement, a material of the first reflecting layer 201 may also include other materials such as molybdenum, niobium and titanium, as long as it can reflect the detection light, reduce the reflected light entering human eyes and reduce the newton rings.

Optionally, a material of the first light absorbing layer 202, the second light absorbing layer 302 and the third light absorbing layer 402 includes molybdenum oxide (MoOx), and a material of the at least one marking member 204, the at least one bonding lead 205, the at least one driving signal line 30 and the at least one signal connection line 31 includes copper (Cu). Molybdenum oxide has low light reflectivity and is of a black color, which is beneficial to absorbing light. It may absorb at least the external ambient light irradiating on the at least one marking member, the at least one bonding lead, the at least one driving line and the at least one signal connection line, which reduces the reflected ambient light, then reduces the ambient light entering the eyes of the observer, and reduces or even eliminates the newton rings.

Optionally, a thickness of the first reflecting layer 201 may be in a range from 200 angstroms to 300 angstroms. In one specific example, a thickness of the first reflecting layer 201 may be 250 angstroms to facilitate the reflection of the detection light by the first reflecting layer 201.

Optionally, a thickness of the first light absorbing layer 202, the second light absorbing layer 302 and the third light absorbing layer 402 is in a range from 400 angstroms to 500 angstroms to ensure that they may absorb a predetermined amount of ambient light.

Optionally, orthographic projections of the at least one marking member 204 and the at least one bonding lead 205 on the first substrate 200 are respectively in an orthographic projection of the first light absorbing layer 202 on the first substrate 200, an orthographic projection of the at least one driving signal line 30 on the first substrate 200 are in an orthographic projection of corresponding second light absorbing layer 302 on the first substrate 200, and an orthographic projection of the at least one signal connection line 31 on the first substrate 200 is in an orthographic projection of the third light absorbing layer 402 on the first substrate 200. In this way, the areas of the first light absorbing layer 202, the second light absorbing layer 302 and the third light absorbing layer 402 can be increased, thereby absorbing ambient light to the maximum.

Optionally, the orthographic projections of the at least one marking member 204 and the at least one bonding lead 205 on the first substrate 200 at least partially overlap with an orthographic projection of the first reflecting layer 201 on the first substrate 200. In this way, the positions corresponding to the at least one marking member 204 and the at least one bonding lead 205 can be determined by the detection light reflected back by the first reflecting layer 201.

Figure 6:
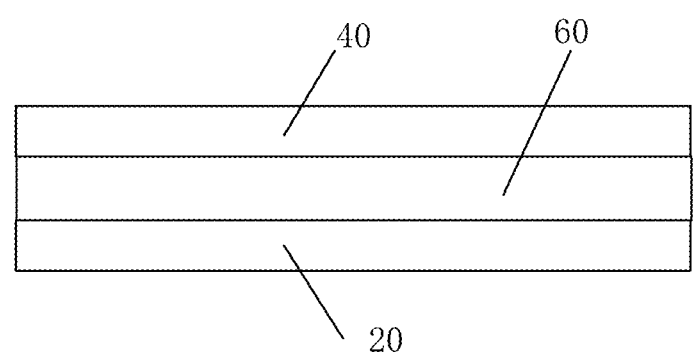
FIG. 6 is a schematic diagram illustrating a structure of a display panel according to an embodiment of the present disclosure.

FIG. 6 is a schematic diagram illustrating a structure of a display panel according to an embodiment of the present disclosure. Optionally, as shown in FIG. 6, the display panel includes the array substrate 20 described above, and further includes: a color filter substrate 40 opposite to the array substrate 20; and a liquid crystal layer 60 between the color filter substrate 40 and the array substrate 20. In other words, the display panel is a liquid crystal display panel. In a direction away from the observer, the array substrate 20, the liquid crystal layer 60 and the color filter substrate 40 are arranged sequentially, and the first substrate 200 in the array substrate 20 is on a side distal to the liquid crystal layer 60, that is, the first substrate 200 is close to the observer.

In the display panel of the present disclosure, since the first reflecting layer 201 is provided on a side, proximal to the detection light, of the at least one marking member 204 in the at least one marking sub-region 221 and the at least one bonding lead 205 in the at least one bonding sub-region 222, and the positions of the at least one marking member 204 and the at least one bonding lead 205 are determined by the detection light reflected by the first reflecting layer 201, the identification of the at least one marking member 204 and the determination of the number of the at least one bonding lead 205 can be achieved. Since the first light absorbing layer 202 is provided between the at least one marking member 204 in the at least one marking sub-region 221 and the first reflecting layer 201, and between the at least one bonding lead 205 in the at least one bonding sub-region 222 and the first reflecting layer 201, the second light absorbing layer 302 is provided between the at least one driving signal line 30 in the display region 21 and/or the at least one driving sub-region 223 and the first substrate 200, and the third light absorbing layer 402 is provided between the at least one signal connection line 31 in the fan-out sub-region 224 and the first substrate 200, the reflected light of the metal members facing the observer can be reduced, the newton rings can be reduced or even eliminated, the visual effect can be improved, and it is especially suitable for borderless display panels.

Figure 7:
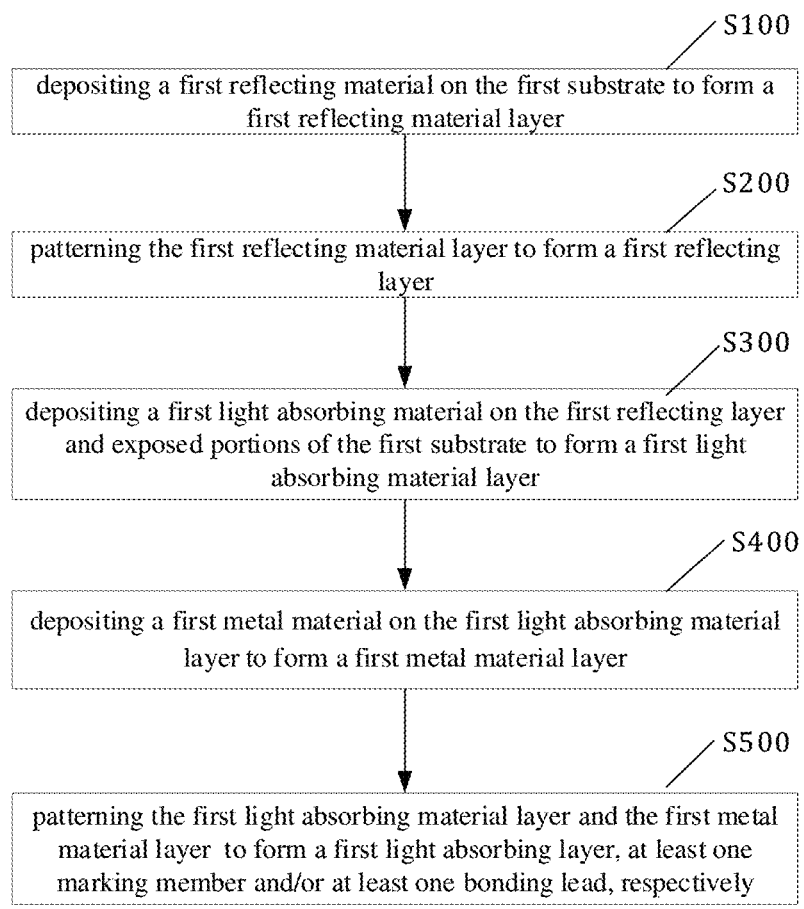
FIG. 7 is a flow chart of a method for manufacturing an array substrate according to an embodiment of the present disclosure.
Figure 8A:
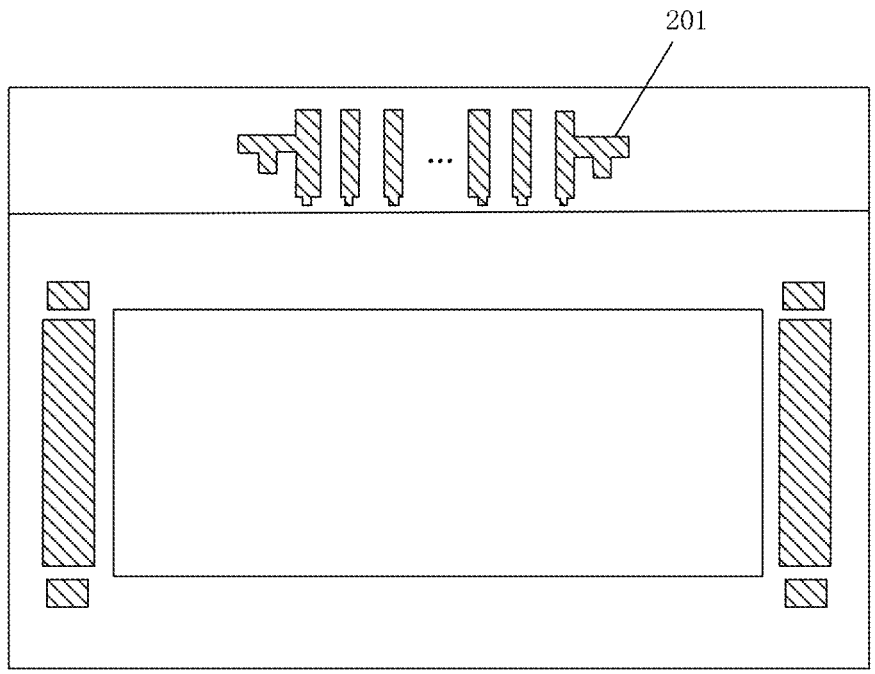
FIGS. 8a to 8b are cross-sectional views of resulted structures in steps of a process of manufacturing an array substrate according to an embodiment of the present disclosure.
Figure 8B:
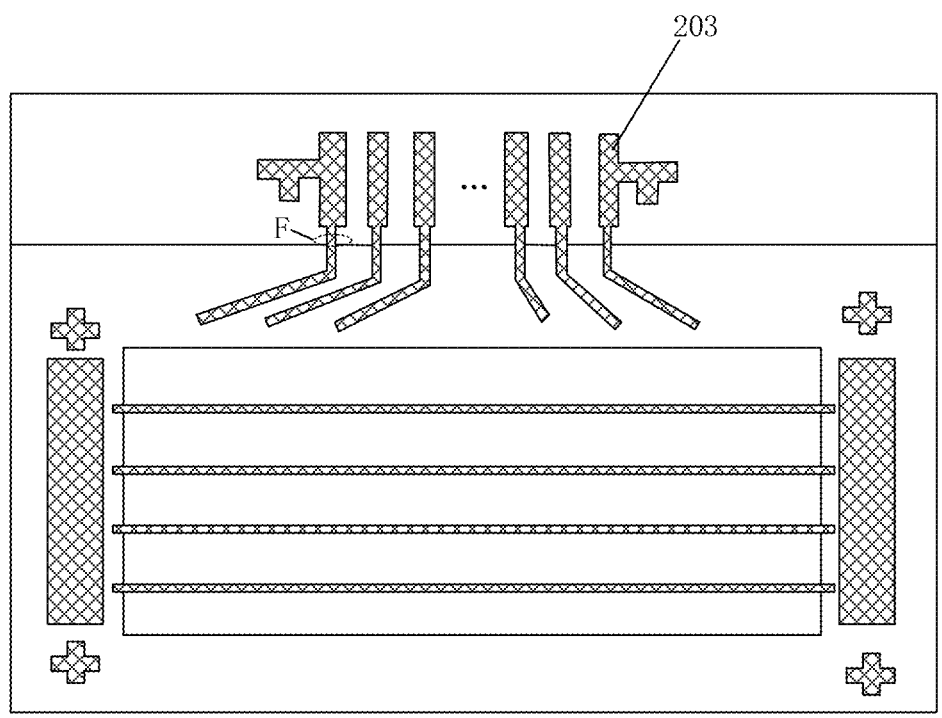

According to another aspect of the present disclosure, a method for manufacturing the above array substrate is further provided. The method for manufacturing the array substrate includes forming at least one marking member and/or at least one bonding lead. FIG. 7 is a flow chart of a method for manufacturing an array substrate according to an embodiment of the present disclosure, specifically a flow chart for forming the at least one marking member and/or the at least one bonding lead. FIGS. 8a to 8b are cross-sectional views of resulted structures in steps of a method of manufacturing an array substrate according to an embodiment of the present disclosure. The method for manufacturing the array substrate is described in detail below with reference to FIGS. 7 and 8a to 8b.

In step S100, a first reflecting material is deposited on the first substrate to form a first reflecting material layer. Specifically, a layer of Molybdenum niobium material may be deposited on the first substrate by a sputtering process to form a first reflecting material layer.

In step S200, the first reflecting material layer is patterned to form a first reflecting layer. Specifically, a patterning process, such as exposure, development, and etching, may be used to process the first reflecting material layer to form a pattern of the first reflecting layer 201, as shown in FIG. 8a. The pattern of the first reflecting layer is located in the bonding sub-region and the marking sub-region of the array substrate. The first reflecting layer may have a thickness in a range from 200 angstroms to 300 angstroms. In one specific example, the first reflecting layer may have a thickness of 250 angstroms.

In step S300, a first light absorbing material is deposited on the first reflecting layer and exposed portions of the first substrate to form a first light absorbing material layer. Specifically, the first light absorbing material layer may be formed by coating and deposition. The first light absorbing material may include molybdenum oxide.

In step S400, a first metal material is deposited on the first light absorbing material layer to form a first metal material layer. Specifically, the first metal material layer may be formed by sputtering and deposition. The first metal material may include copper.

In step S500, the first light absorbing material layer and the first metal material layer are patterned to form a first light absorbing layer, at least one marking member and/or at least one bonding lead, respectively. Specifically, the first light absorbing material layer and the first metal material layer may be processed by a patterning process, such as exposure, development, etching, etc., to form a pattern of the first light absorbing layer, the at least one marking member and/or the at least one bonding lead, as shown in FIG. 8b. Orthographic projections of the at least one marking member and/or the at least one bonding lead on the first substrate at least partially overlaps with an orthographic projection of corresponding first reflecting layer on the first substrate, thus facilitating the determination of the positions and number of the at least one marking member and/or the at least one bonding lead.

Optionally, the method for manufacturing the above array substrate further includes forming a second light absorbing layer and at least one driving signal line (such as a gate line). When forming the second light absorbing layer and the at least one driving signal line, the second light absorbing layer may be formed in a same and single process as forming the first light absorbing layer, and the at least one driving signal line may be formed in a same and single process as forming the at least one marking member and/or the at least one bonding lead, thereby simplifying the manufacturing process. Moreover, the second light absorbing layer is formed in the at least one driving sub-region of the peripheral region and the display region of the array substrate, and the at least one driving signal line is on a side of the second light absorbing layer distal to the first substrate.

Optionally, the method for manufacturing the above array substrate further includes forming a third light absorbing layer and at least one signal connection line. The third light absorbing layer is formed in a same and single process as forming the first light absorbing layer, and the at least one signal connection line is formed in a same and single process as forming the at least one marking member and/or the at least one bonding lead, such that the at least one signal connection line is in at least one fan-out sub-region of the peripheral region of the array substrate, and the third light absorbing layer is between the at least one bonding lead and the first substrate at connection positions of the at least one bonding lead with the at least one signal connection line (corresponding to a region F in FIG. 8b).

The final formed pattern 203 of the at least one marking member, the at least one bonding lead, the at least one driving signal line and the at least one signal connection line is shown in FIG. 8b.

In the related art, firstly, a light absorbing material layer (such as MoOx) is usually formed on a substrate, and the light absorbing material layer is etched to expose the substrate at the positions corresponding to marking members and bonding leads. Then, a reflecting material layer (such as MoNb) and a metal material layer (such as Cu) are formed. As a result, when a single process is used to etch the light absorbing material layer, the reflecting material layer, and the metal material layer to form a light absorbing layer, a reflecting layer, and the marking members and the bonding leads, two layers of materials are needed to be etched at some locations (the reflecting material layer and the metal material layer at positions, which are the positions corresponding to the marking members and the bonding leads and exposing the substrate), and three layers of materials are needed to be etched at some positions (the light absorbing material layer, the reflecting material layer and the metal material layer at positions, which are not the positions corresponding to the marking members and the bonding leads and exposing the substrate), that is, if it is a three-layer structure of MoOx-MoNb—Cu, a structure surrounding the three-layer structure is a two-layer structure of MoNb—Cu. In this way, when etching, the three-layer structure in some positions and the two-layer structure in some positions of the array substrate needs to be etched, it will result in nonuniformity of etching and cannot achieve mass production. In the present disclosure, firstly a first reflecting material layer (such as MoNb) is formed on the first substrate. Then, the first reflecting material layer is etched to form a pattern of a reflecting layer corresponding to at least one marking member and/or at least one bonding lead. Then, a light absorbing material layer (such as MoOx) and a metal material layer (such as Cu) are successively formed. When the light absorbing material layer and the metal material layer are etched by a single process, a light absorbing layer (including the first light absorbing layer, the second light absorbing layer and the third light absorbing layer of the present disclosure) and a metal layer (including the at least one marking member, the at least one bonding lead, the at least one driving signal line and the at least one signal connection line of the present disclosure) are formed at the same time. In this way, only two layers of materials (the light absorbing material layer and the metal material layer) need to be etched, which solves the problem of etching uniformity in the related art and can achieve mass production.

It should be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

What is claimed is:

1. An array substrate, comprising a display region and a peripheral region at least partially surrounding the display region, the peripheral region comprising at least one marking sub-region and/or at least one bonding sub-region, the at least one marking sub-region being provided with at least one marking member, and the at least one bonding sub-region being provided with at least one bonding lead, wherein the at least one marking sub-region and/or the at least one bonding sub-region is further provided with:
a first substrate;
a first reflecting layer on the first substrate; and
a first light absorbing layer on a side of the first reflecting layer distal to the first substrate, wherein the at least one marking member and/or the at least one bonding lead is on a side of the first light absorbing layer distal to the first substrate;
wherein the peripheral region further comprises at least one driving sub-region, at least one of the display region and the at least one driving sub-region is provided with at least one driving signal line, and the at least one of the display region and the at least one driving sub-region is further provided with: a second light absorbing layer on the first substrate, wherein the at least one driving signal line is on a side of the second light absorbing layer distal to the first substrate; and
the peripheral region further comprises at least one fan-out sub-region, the at least one fan-out sub-region is provided with at least one signal connection line, and the at least one signal connection line is configured to couple the at least one bonding lead to the at least one driving signal line in a one-to-one correspondence; and a third light absorbing layer is further provided between the at least one bonding lead and the first substrate at connection positions of the at least one bonding lead with the at least one signal connection line.

2. The array substrate of claim 1, wherein the first light absorbing layer, the second light absorbing layer and the third light absorbing layer are in a same layer; and the at least one marking member, the at least one bonding lead, the at least one driving signal line and the at least one signal connection line are in a same layer.

3. The array substrate of claim 2, wherein a material of the first reflecting layer comprises molybdenum niobium.

4. The array substrate of claim 3, wherein the first reflecting layer has a thickness from 200 angstrom to 300 angstrom.

5. The array substrate of claim 4, wherein the first reflecting layer has a thickness of 250 angstrom.

6. The array substrate of claim 1, wherein a material of the first light absorbing layer, the second light absorbing layer and the third light absorbing layer comprises molybdenum oxide, and a material of the at least one marking member, the at least one bonding lead, the at least one driving signal line and the at least one signal connection line comprises copper.

7. The array substrate of claim 6, wherein a thickness of the first light absorbing layer, the second light absorbing layer and the third light absorbing layer is in a range from 400 angstrom to 500 angstrom.

8. The array substrate of claim 1, wherein orthographic projections of the at least one marking member and the at least one bonding lead on the first substrate are in an orthographic projection of the first light absorbing layer on the first substrate respectively;

an orthographic projection of the at least one driving signal line on the first substrate is in an orthographic projection of the second light absorbing layer on the first substrate; and an orthographic projection of the at least one signal connection line on the first substrate is in an orthographic projection of the third light absorbing layer on the first substrate.

9. The array substrate of claim 1, wherein orthographic projections of the at least one marking member and the at least one bonding lead on the first substrate at least partially overlap with an orthographic projection of the first reflecting layer on the first substrate.

10. The array substrate of claim 1, wherein at least one driving signal line in at least one display region is a gate line.

11. A display panel, comprising:
the array substrate of claim 1;
a color filter substrate opposite to the array substrate; and
a liquid crystal layer between the array substrate and the color filter substrate, wherein a first substrate in the array substrate is on a side of the array substrate distal to the liquid crystal layer.

12. A method for manufacturing an array substrate, comprising:
providing a first substrate;
forming a first reflecting layer on the first substrate;
forming a first light absorbing layer on the first reflecting layer; and
forming at least one marking member and/or at least one bonding lead on the first light absorbing layer, such that the first reflecting layer and the first light absorbing layer are in at least one marking sub-region and/or in at least one bonding sub-region in a peripheral region of the array substrate, the at least one marking member is on the first light absorbing layer in the at least one marking sub-region, the at least one bonding lead is on the first light absorbing layer in the at least one bonding sub-region, wherein the array substrate further comprises a display region, and the peripheral region at least partially surrounds the display region;
the method further comprises:
forming a second light absorbing layer and at least one driving signal line, wherein forming a second light absorbing layer and at least one driving signal line comprises: forming the second light absorbing layer in a same process as forming the first light absorbing layer, forming the at least one driving signal line in a same process as forming the at least one marking member and/or the at least one bonding lead, such that the second light absorbing layer is in at least one driving sub-region in the peripheral region and the display region of the array substrate, and the at least one driving signal line is on a side of the second light absorbing layer distal to the first substrate; and
forming a third light absorbing layer and at least one signal connection line, wherein forming a third light absorbing layer and at least one signal connection line comprises: forming the third light absorbing layer in a same process as forming the first light absorbing layer, forming the at least one signal connection line in a same process as forming the at least one marking member and/or the at least one bonding lead, such that the at least one signal connection line is in at least one fan-out sub-region in the peripheral region of the array substrate, and the third light absorbing layer is between the at least one bonding lead and the first substrate at connection positions of the at least one bonding lead and the at least one signal connection line.

13. The method of claim 12, wherein forming the first reflecting layer on the first substrate comprises forming the first reflecting layer by molybdenum niobium.

14. The method of claim 13, wherein the first reflecting layer has a thickness in a range from 200 angstrom to 300 angstrom.

15. The method of claim 14, wherein the first reflecting layer has a thickness of 250 angstrom.

16. The method of claim 15, wherein forming the at least one marking member and/or the at least one bonding lead on the first light absorbing layer comprises forming the at least one marking member and/or the at least one bonding lead on the first light absorbing layer such that orthographic projections of the at least one marking member and/or the at least one bonding lead on the first substrate at least partially overlap with an orthographic projection of the first reflecting layer on the first substrate.

* * * * *